(12) United States Patent
Torrents Abad et al.

(10) Patent No.: US 11,145,797 B1
(45) Date of Patent: Oct. 12, 2021

(54) FORMING CONFORMABLE LAYER WITH FLAP ON SEMICONDUCTOR DEVICES

(71) Applicant: Facebook Technologies, LLC, Menlo Park, CA (US)

(72) Inventors: Oscar Torrents Abad, Saarbrucken (DE); Tilman Zehender, Cork (IE); Pooya Saketi, Cork (IE); Karsten Moh, Saarbrucken (DE)

(73) Assignee: Facebook Technologies, LLC, Menlo Park, CA (US)

( * ) Notice: Subject to any disclaimer, the term of this patent is extended or adjusted under 35 U.S.C. 154(b) by 91 days.

(21) Appl. No.: 16/263,477

(22) Filed: Jan. 31, 2019

Related U.S. Application Data

(60) Provisional application No. 62/668,728, filed on May 8, 2018.

(51) Int. Cl.
  *H01L 33/62* (2010.01)
  *H01L 33/26* (2010.01)
  *H01L 33/14* (2010.01)
  *H01L 33/50* (2010.01)

(52) U.S. Cl.
  CPC .............. *H01L 33/62* (2013.01); *H01L 33/14* (2013.01); *H01L 33/26* (2013.01); *H01L 33/502* (2013.01); *H01L 2933/0033* (2013.01); *H01L 2933/0066* (2013.01)

(58) Field of Classification Search
  CPC ....... H01L 33/44; H01L 33/48; H01L 33/486; H01L 33/50; H01L 33/505; H01L 33/507; H01L 33/52; H01L 33/54; H01L 33/56; H01L 33/62; H01L 33/14; H01L 33/26; H01L 33/502; H01L 2933/0033; H01L 2933/0066
  See application file for complete search history.

(56) References Cited

U.S. PATENT DOCUMENTS

2017/0222094 A1 * 8/2017 Haiberger ............... H01L 33/62

* cited by examiner

*Primary Examiner* — Sue A Purvis
*Assistant Examiner* — Scott Stowe
(74) *Attorney, Agent, or Firm* — Fenwick & West LLP

(57) ABSTRACT

Embodiments relate to forming an elastomeric interface layer (elayer) with a flap over multiple light emitting diode (LED) dies by forming materials across multiple LED dies and removing the materials between the LED dies. The formed flap of the elayer provides a large surface area for adhesion between each LED and a pick-up surface. For example, the flap may have a surface area that is larger than the light emitting surface of the LED die, or larger than the surface area of an elastomeric interface layer without the flap. As such, the elayer allows each LED to be picked up by a pick-up surface and placed onto a display substrate including control circuits for sub-pixels of an electronic display. In some embodiments, the LED dies are micro-LED (μLED) dies.

20 Claims, 16 Drawing Sheets

200

Form a frame along a side surface of an LED die on a carrier substrate to define a recessed region with the LED die and frame
202

Deposit a conformable material on the LED die including in the recessed region, over the recessed region, and over the frame
204

Remove a peripheral portion of the conformable material to define a conformable flap with remaining portion of the top portion
206

Remove the frame such that an elastomeric interface layer (elayer) including the conformable flap is on the LED die
208

FORMING CONFORMABLE LAYER WITH FLAP ON SEMICONDUCTOR DEVICES

BACKGROUND

The present disclosure relates to semiconductor device fabrication, specifically to placing a conformable material with a flap over light emitting diode (LED) dies to facilitate adhesive attachment in display fabrication.

In LED display fabrication, LEDs may be moved from one substrate to another. For example, micro-LEDs of different colors may be transferred from carrier substrates to a display substrate including control circuits for the micro-LEDs to manufacture an electronic display. As the form factor of LED's decreases, the picking and placing of LEDs into desired arrangements and without damaging the LED dies becomes increasingly difficult.

SUMMARY

Embodiments relate to forming a conformable interface layer with a flap on semiconductor devices to facilitate and increase adhesion with a pick-up head for pick and place operations during the manufacturing of an electronic display.

In some embodiments, a frame is formed along a side surface of a light emitting diode (LED) die on a carrier substrate. The frame extends above the light emitting surface of the LED die such that the frame and the light emitting surface define a recessed region. A conformable material is deposited in the recessed region, over the recessed region, and over the frame to form a body portion of the comfortable material within the recessed region and a top portion of the conformable material over the body portion. The top portion is wider than the body portion and extends over the top of the frame. A peripheral portion of the top portion that extends over the top of the frame is removed to define a conformable flap from the remaining portion of the top portion (referred to as the inner portion). Furthermore, removal of the peripheral portion exposes a portion of the top of the frame. The frame is then removed, leaving a conformable interface layer of the LED die including the body portion and the conformable flap of the conformable material.

In some embodiments, the conformable flap of the conformable interface layer defines a first surface area at the top of the conformable interface layer that is larger than a second surface area of the body portion at the bottom of the conformable interface layer facing the light emitting surface. The conformable flap defines a first width that is larger than a second width of the body portion.

In some embodiments, the LED die on the carrier substrate is picked up by attaching a non-conformable pick-up head to the conformable interface layer over the light emitting surface of the LED die. The LED die attached to the non-conformable pick-up head is placed on a display substrate including a pixel control circuit of an electronic display.

In some embodiments, many LED dies are present on the carrier substrate such that a conformable interface layer with a conformable flap is formed over each of the LED dies on the carrier substrate in parallel. For example, an array matrix of LED dies are located on the carrier substrate. A frame is formed between each of the LED dies to form recessed regions defined by the frame and the light emitting surfaces of the LED dies. The frame may be a layer of material with apertures that expose the light emitting surfaces of the LED dies. The conformable material is deposited in the recessed regions to form body portions and over the frame to form top portions. For example, a layer of the conformable material may form the body portions and the top portions over each of the LED dies. Peripheral portions of the top portions of the conformable material are removed to define individual conformable flaps of the conformable material over each of the LED dies with the remaining portions of the top portion and to expose the frame. The frame is removed between each of the LED dies, resulting in a conformable interface layer with a conformable flap on each of the LED dies.

BRIEF DESCRIPTION OF DRAWINGS

Figure (FIG. 1 is a cross sectional view of LED dies on a carrier substrate with an elastomeric interface layer (elayer) over each LED die, according to one embodiment.

FIG. 2 is a flowchart of a method for forming an elayer with a flap over an LED die on a carrier substrate, according to one embodiment.

The figures depict various embodiments of the present disclosure for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments relate to forming an elastomeric interface layer (elayer) with a flap over multiple light emitting diode (LED) dies by forming materials across multiple LED dies and removing the materials between the LED dies. The formed flap of the elayer provides a large surface area for adhesion between each LED and a pick-up surface. For example, the flap may have a surface area that is larger than the light emitting surface of the LED die, or larger than the surface area of an elastomeric interface layer without the flap. As such, the elayer allows each LED to be picked up by a pick-up surface and placed onto a display substrate including control circuits for sub-pixels of an electronic display. In some embodiments, the LED dies are micro-LED (μLED) dies.

Figure 1:
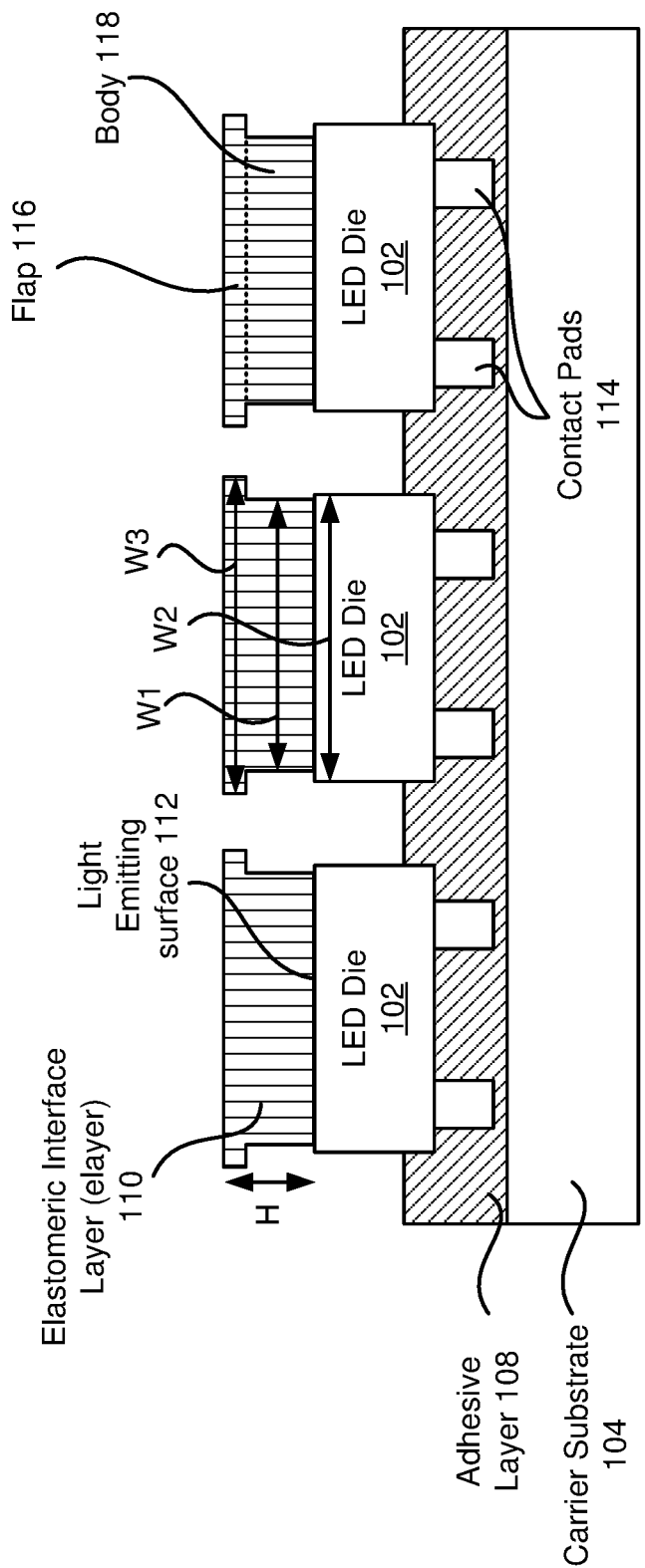

FIG. 1 is a cross sectional view of LED dies 102 on a carrier substrate 104 with an elastomeric interface layer (elayer) 110 over each LED die 102, according to one embodiment. The carrier substrate 104 may include an adhesive layer 108. The elayer 110 is formed on the light emitting surface 112 of each LED die 102, and the other side of the LED dies 102 including contact pads 114 are attached to the carrier substrate 104 by an adhesive layer 108 (the carrier substrate 104 and adhesive layer 108 may also be referred to as the hardhandle). The elayer 110 is a conformable material layer that allows each of the LED dies 102 to be adhesively attached to and picked up by a pick-up surface of a pick and place head (described with reference to FIG. 13). The elayer 110 includes a body 118 and a flap 116 of conformable material.

Each of the LED dies 102 emit light from the light emitting surface 112 if an electric potential is applied between electrical contact pads 114. The electrical contact pads 114 serve as interconnects for the LED dies 102 when the LED dies 102 are mounted to a display substrate. In some embodiments, the LED dies 102 have an epitaxial structure that emits light formed from Gallium nitride (GaN), gallium arsenide (GaAs), or gallium phosphide (GaP). In some embodiments, the LED dies 102 are micro-LED (uLED) dies. A structure of the LED dies 102 is further described with reference to FIG. 15. In some embodiments, the discussion herein with respect to LED dies 102 may be applicable to vertical-cavity surface-emitting lasers (VCSELs). For example, an elayer 110 may be formed on a VCSEL to facilitate pick and place of the VCSEL. Although formation of the elayer is discussed in greater detail herein for light emitting devices, the elayer may be formed on other types of devices to facilitate pick and place operations.

The elayer 110 includes conformable material that allows the LED dies 102 to be picked up by a pick-up surface due to adhesion forces, such as Van der Waals forces. In some embodiments, the elayer 110 is a polymer thermoset that is cured through light exposure (e.g., Ultraviolet (UV) light) or heat exposure. The elayer 110 can include a material that can be cured from a liquid form and when cured provides sufficient adhesion to (e.g., non-conformable) pick-up surfaces. For example, the elayer 110 may include elastomeric material, such as Polydimethylsiloxane (PDMS) or Polyurethane (PU). The elastomeric material may be a polymer with viscoelasticity (having both viscosity and elasticity). The elastomeric material may also have weak inter-molecular forces, a low Young's modulus, and/or high failure strain compared with other materials. In another example, the elayer 110 contains no elastomeric materials. For example, the elayer 110 may include gels that provides adhesion via covalent chemical bonds.

The elayer 110 includes a conformable flap 116 and body 118. In some embodiments, the body 118 has a width W1 that is similar to the width W2 of the LED die 102. The flap 116 has a width W3 that is larger than the width W1 of the body 118 so that the flap 116 extends over the sides of the body 118. Thus, compared to the body 118, the flap 116 increases the surface area of the elayer 110 available for adhesive attachment. Furthermore, the elayer 110 provides for absorption of impact when a pick-up surface contacts the elayer 110. The height H of elayer 110 can depend on the viscoelastic properties of the elayer 110 material used. In some embodiments, the determined thickness is a compromise between mechanical stability and adhesion provided by the elayer 110. In some embodiments, the height H of the elayer 110 is a few micrometers or less.

The carrier substrate 104 has a flat surface mounted with the LED dies 102 that supports the LED dies 102 during the process of forming the elayer 110 over the LED dies 102. The carrier substrate 104 may have any number of LED dies 102 attached to it, such as one or more arrays (e.g., a matrix) of LED dies. The carrier substrate 104 may be a hard flat surface, sufficiently rigid to support the LED dies 102 (e.g., during pick and place operations, or when the carrier substrate 104 is moved). In some embodiments, the carrier substrate 104 is mounted with other types of semiconductor devices, such as photodiodes or VCELs, to facilitate placement of the semiconductor devices. The LED dies 102 can be attached to the carrier substrate 104 by an adhesive layer 108. In some embodiments, the LED dies 102 are removed from the carrier substrate 104 by removing the adhesive layer 108 with a solvent. In other embodiments, the adhesive 108 is weak enough that the LED dies 102 may be removed with force (e.g., by a pick and place head) without damaging the LED dies 102. In other embodiments, portions of the adhesive layer 108 attached to selected LED dies for pick and place are weakened, such as by treatment with ultraviolet (UV) light or some other process. In some embodiments the carrier substrate 104 is an electrical insulator, such as glass.

FIG. 2 is a flowchart of a method 200 for forming an elayer 110 with a flap 116 over an LED die 102 on a carrier substrate 104, according to one embodiment. Among other advantages, the formation of a flap 116 provides increased adhesion of the elayer 110 to a pick-up surface. The method 200 allows the elayer 110 to be formed without disturbing the positions of the LED dies 102, damaging the LED dies 102, or damaging the elayer 110. Furthermore, the method 200 can be performed to form elayers 110 over multiple LED dies 102 simultaneously. The steps of method 200 may be performed in different orders, and the method 200 may include different, additional, or fewer steps.

A frame is formed 202 along a side surface of an LED die 102 on a carrier substrate 104 such that the frame and LED die 102 define a recessed region. In particular, the frame extends above the light emitting surface 112 of the LED die 102, and together, the frame and the light emitting surface 112 define the recessed region. In some embodiments, the frame extends over a portion of the light emitting surface 112 of the LED die 102.

In some embodiments, the frame is formed 202 in multiple steps. For example, a positive photosensitive material is deposited over the LED die 102, covering the light emitting surface 112 and the side surface of the LED die 102. A mask can then be applied over a first portion of the positive photosensitive material defined around light emitting surface 112 of the LED die 102 such that the mask exposes a second portion of the material over the light emitting surface 112 of the LED die 102. Light is applied to the second portion to cause the second portion of the positive photosensitive material to be soluble. The mask and second portion are removed to form the frame from the first portion of the positive photosensitive material. The forming of the frame 602 is further described with reference to FIGS. 4-6.

A conformable material is deposited 204 over the LED die 102 in the recessed region, over the recessed region, and over the frame. The portion of the conformable material in the recessed region defines a body 118 of the conformable material, and another portion of the conformable material over the body 118 and extending over the frame defines a top portion. An outer portion of the top portion over the frame is referred to as a peripheral portion. In some embodiments, the conformable material includes negative photosensitive material. After the material is deposited, light is applied to cure the material. In some embodiments, the conformable material is cured through heat, instead of light. Depositing and curing the conformable material are further described with reference to FIGS. 7 and 8. In alternative embodiments, the conformable material includes positive photosensitive material.

The peripheral portion of the top portion of the conformable material is removed 206 to define a conformable flap 116 with an inner portion of the conformable material, and to expose the frame. Specifically, the flap 116 includes conformable material over the body 118 and conformable material that extends over the frame after the peripheral portion is removed (this is referred to as the inner portion). In some embodiments, the peripheral portion is removed by an etching process, such as wet or dry etching. To etch the peripheral portion, a mask is applied over the inner portion of the top portion of the conformable material after it is deposited. The mask is aligned such that it exposes the peripheral portion of the top portion of the conformable material, thus allowing the etching process to remove the peripheral portion without removing the inner portion of the conformable material. After etching the peripheral portion, the mask is removed. Applying the mask and removing the peripheral portion are further described with reference to FIGS. 9 and 10.

In embodiments where the conformable material includes positive photosensitive material, light may be applied through the carrier substrate after the material is deposited. By this, a portion of the light is absorbed by the LED die 102 and another portion of the light causes the peripheral portion of the conformable material to become soluble. This prevents the body 118 of the conformable material from light exposure while allowing the peripheral portion between the LED dies 102 to be exposed to light (and rendered soluble). The soluble peripheral portion is then dissolved with a solvent. This is further described with reference to FIGS. 11 and 12.

The frame is removed 208 such that an elayer 110 is on the LED die 102, the elayer 110 including the conformable flap 116 and the body 118 of the conformable material. Since the flap 116 includes a portion of the conformable material that was formed over the frame, the flap 116 can have a top surface area with a width W3 that is larger than the width W1 of the body 118.

In some embodiments, after the elayer 110 is formed, the LED die 102 is picked up by a pick-up surface and moved to a display substrate (described below with reference to FIGS. 13 and 14). For example, the LED die 102 is picked up by attaching a non-conformable pick-up head to the elayer 110. The LED die 102 attached to the non-conformable pick-up head is then placed on a display substrate that includes a pixel control circuit of an electronic display. In these embodiments, the flap 116 of the elayer 110 can provide a surface area for adhesion with the pick-up head that is larger than the surface area of the light emitting surface 112 of the LED die 102, or an interface layer without the flap 116.

Figure 3:
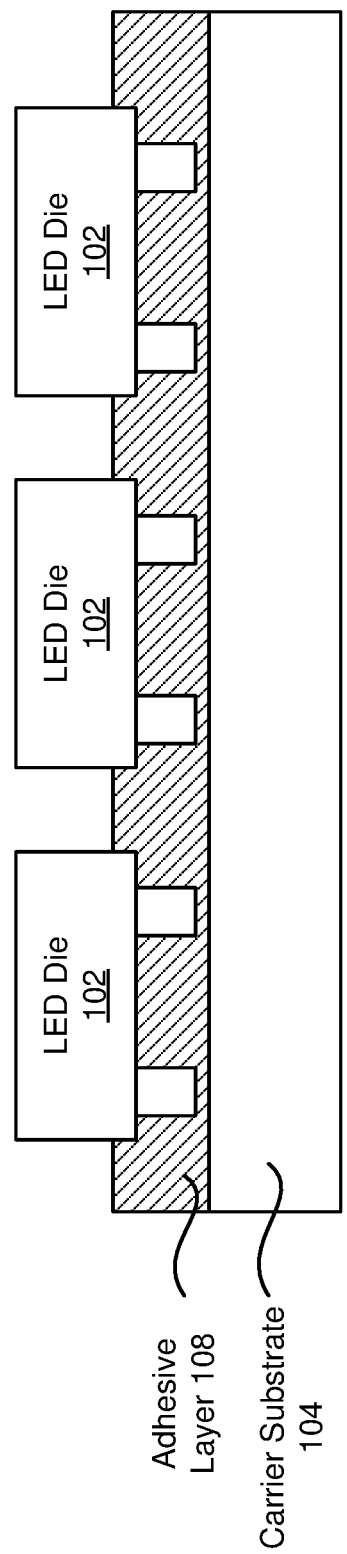
FIG. 3 is a cross sectional view of LED dies on the carrier substrate, according to one embodiment.

FIG. 3 is a cross sectional view of LED dies 102 on the carrier substrate 104, according to one embodiment. The carrier substrate 104 facilitates LED die 102 transfer to a target substrate, such as a display substrate or an intermediate carrier substrate. At the stage shown in FIG. 3, the LED dies 102 do not have elayers 110

Figure 4:
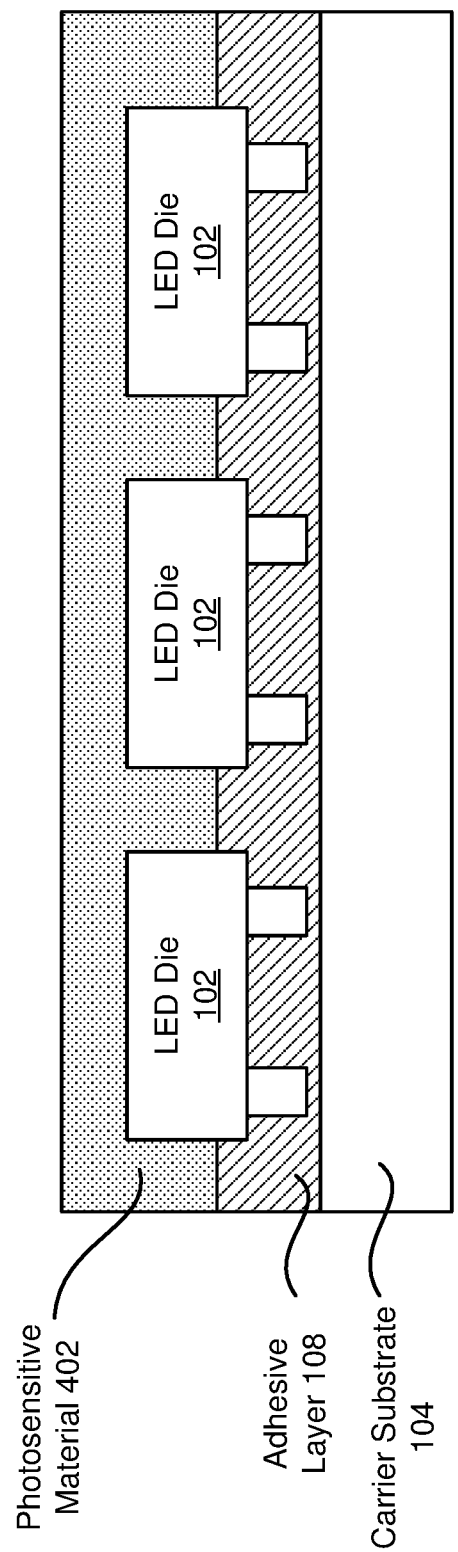
FIG. 4 is a cross sectional view of LED dies on the carrier substrate with positive photosensitive material in the regions between the LED dies and over the LED dies, according to one embodiment.

To form the frame, a (e.g., positive) photosensitive material is deposited over the LED dies 102. FIG. 4 is a cross sectional view of LED dies 102 on the carrier substrate 104 with photosensitive material 402 in the regions between the LED dies 102 and over the LED dies 102, according to one embodiment. In FIG. 4, the photosensitive material 402 is applied so that it covers the top of each LED die 102 and fills the open space between the LED dies 102. The photosensitive material 402 includes physical properties that are altered by light to allow portions of the photosensitive material 402 to be dissolved or otherwise gently removed in a manner that does not damage other portions of the photosensitive material 402. For example, when the photosensitive material 402 is positive photosensitive material, portions of the positive photosensitive material 402 exposed to light become soluble. In some embodiments, the photosensitive material 402 includes a polymer. In some embodiments, specific wavelengths of light render the photosensitive material 402 soluble, such as Ultraviolet (UV) wavelengths. The photosensitive material 402 may be formed by a doctor blade technique or through spin coating or dip coating.

Figure 5:
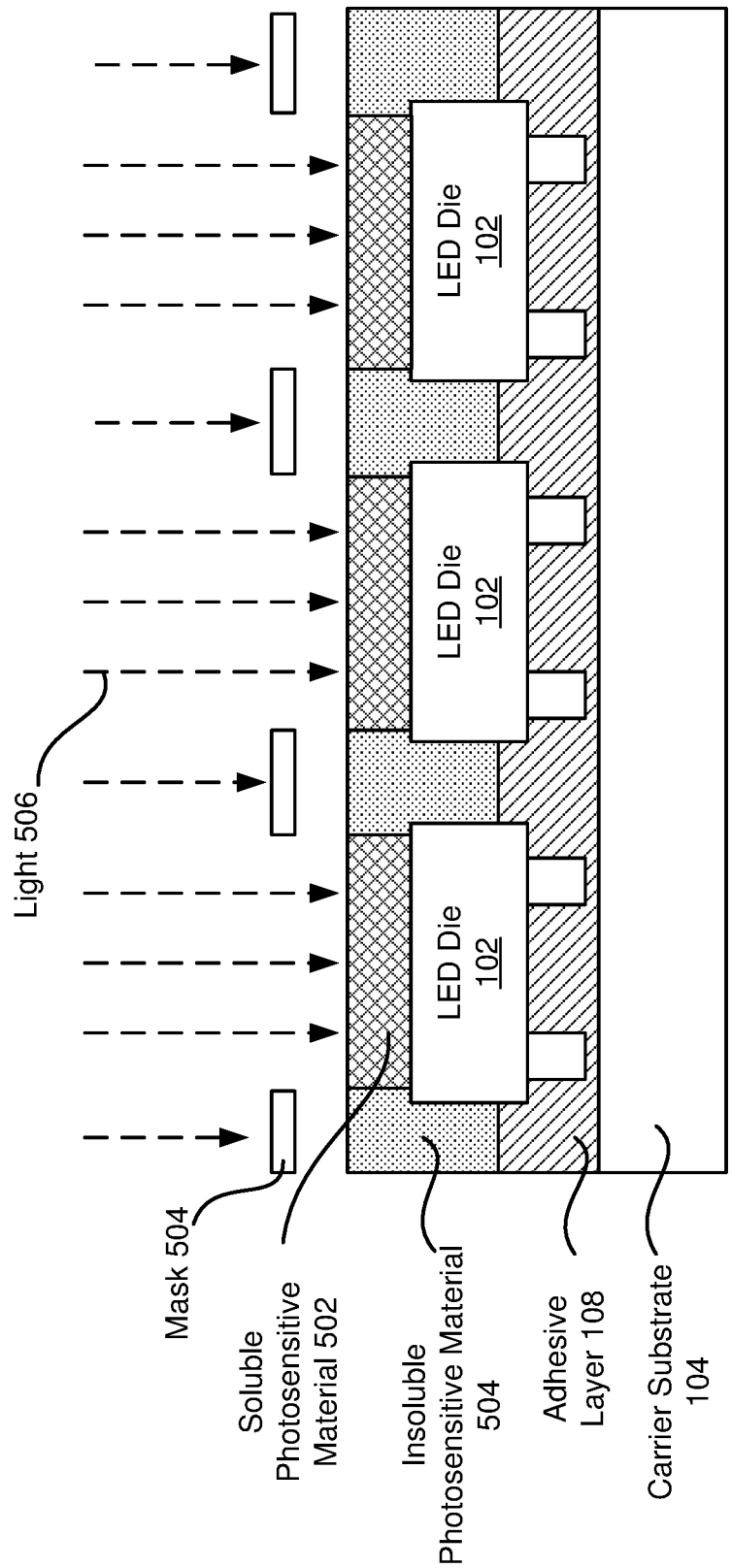
FIG. 5 is a cross sectional view of LED dies on the carrier substrate placed with a mask and portions of photosensitive material exposed to light, according to one embodiment.

To form the frame, light is applied towards the photosensitive material 402 through a mask. FIG. 5 is a cross sectional view of LED dies 102 on the carrier substrate 104 with a mask 504 and portions of photosensitive material 402 exposed to light 506, according to one embodiment. In the example of FIG. 5, the photosensitive material 402 is positive photosensitive material. The mask 504 covers portions of the positive photosensitive material 402 between the LED dies 102 so that the light 506 only shines on the regions of the material over the LED dies 102. The portions of the positive photosensitive material 402 exposed to the light 506 become soluble photosensitive material 502 and can be removed with a solvent, while portions of the positive photosensitive material 402 shielded from the light 506 remain insoluble photosensitive material 504. In some embodiments, the photosensitive material 402 is negative photosensitive material. Here, a mask covers portions of the negative photosensitive material 402 over the LED dies 102 so that the light 506 only shines on the regions of the photosensitive material between the LED dies 102, causing the regions of the photosensitive material 402 between LED dies 102 to be insoluble while the regions of the photosensitive material over the LED dies remain soluble.

Figure 6:
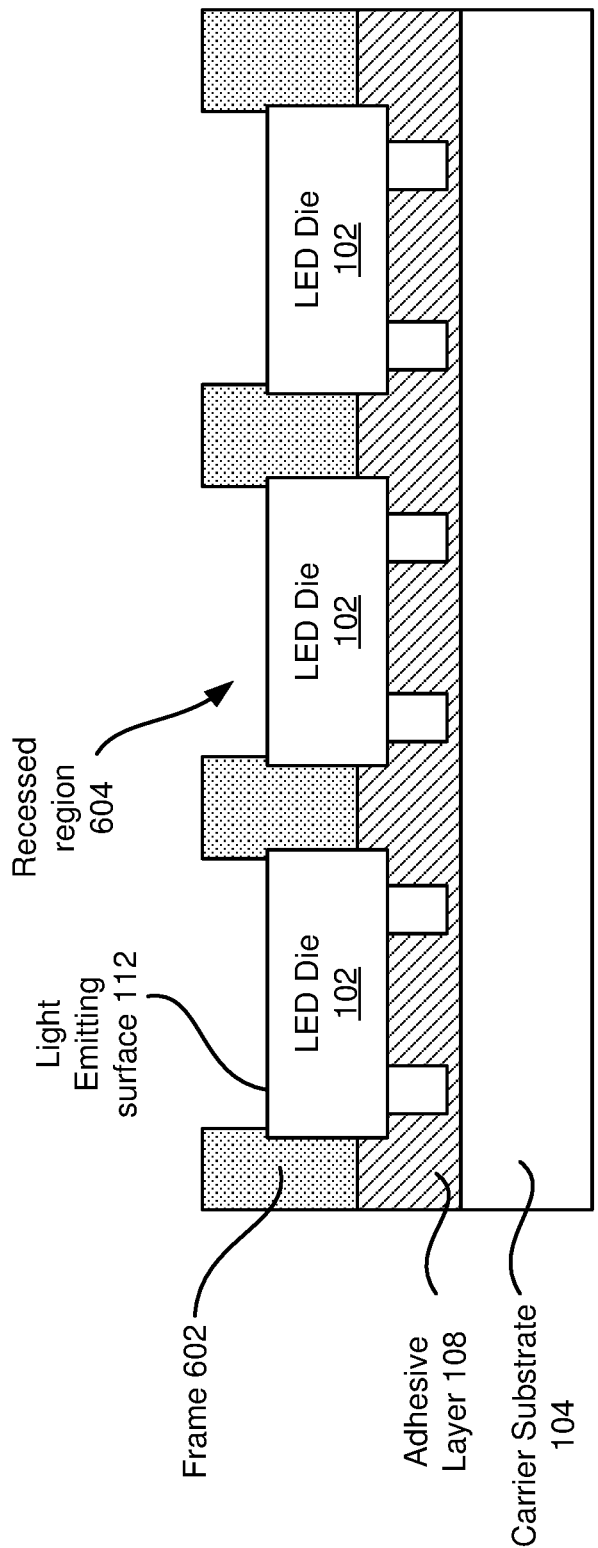
FIG. 6 is a cross sectional view of LED dies on the carrier substrate with regions of the insoluble photosensitive material forming a frame, according to one embodiment.

FIG. 6 is a cross sectional view of LED dies 102 on the carrier substrate 104 with regions of the insoluble photosensitive material 504 forming the frame 602, according to one embodiment. After the portions of the soluble photosensitive material 502 over the LED dies 102 are removed, the remaining portions of insoluble photosensitive material 504 form the frame 602. For an array of LED dies, the frame 602 may be defined between adjacent LED dies 102 and extends above the light emitting surfaces 112 of the LED dies 102. In some embodiments, the frame 602 extends over a portion of the light emitting surfaces 112 of the LED dies 102 (e.g., as may be controlled by the mask 504). Together, the frame 602 and a light emitting surface of a LED dies 102 forms a mold that defines a recessed region 604.

Figure 7:
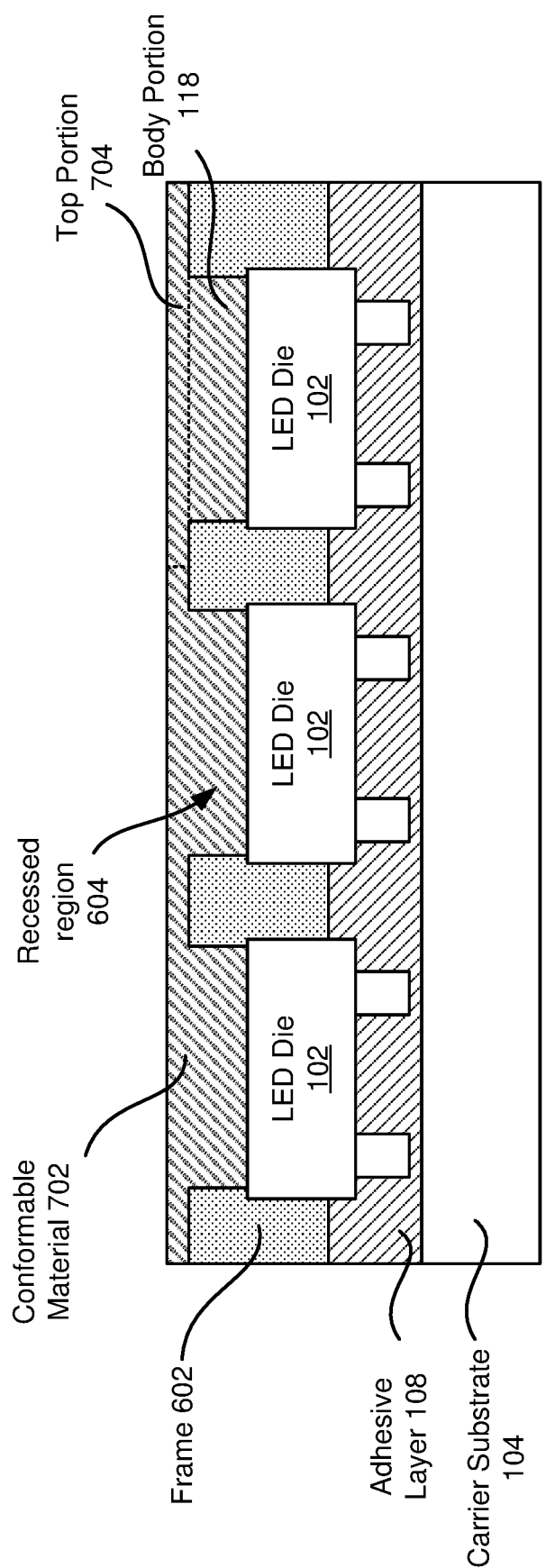
FIG. 7 is a cross sectional view of LED dies on the carrier substrate with conformable material over the LED dies and the frame, according to one embodiment.

To form an elayer 110 with a flap over each LED die 102, a conformable material may be deposited on the LED dies 102 including in the recessed regions 604. FIG. 7 is a cross sectional view of LED dies 102 on the carrier substrate 104 with conformable material 702 over the LED dies 102 and the frame 602, according to one embodiment. Specifically, the conformable material 702 fills in the recession regions 604 and covers the frame 602. For each LED die 102, the conformable material 702 within the recessed region 604 is referred to as the body 118 and the material 702 over the recessed region 604 and the frame 602 is referred to as the top portion 704. The conformable material 702 is used to form the elayers 110. In some embodiments, the conformable material 702 is a polymer. Similar to the photosensitive material 402, the conformable material 702 may be formed by a doctor blade technique, through spin coating, or some other deposition technique. In some embodiments, the conformable material 702 includes negative photosensitive material such that it becomes cured if exposed to light.

Figure 8:
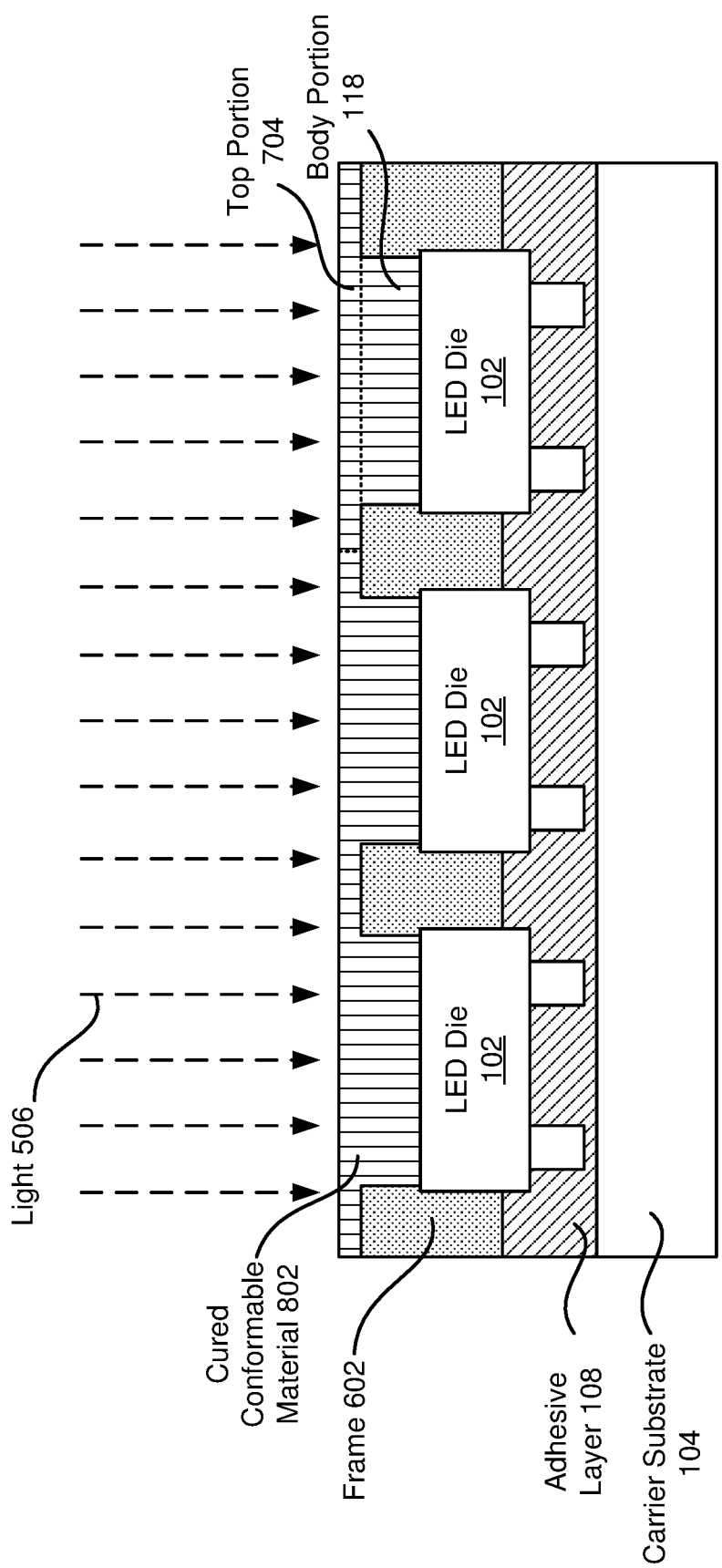
FIG. 8 is a cross sectional view of the conformable material on the LED dies being exposed to light for curing, according to one embodiment.

FIG. 8 is a cross sectional view of the conformable material 802 on the LED dies 102 being exposed to light 506 for curing, according to one embodiment. The light 506 cures the conformable material 702 such that it becomes cured conformable material 802. For example, the light 506 polymerizes the conformable material 702. In some embodiments, specific wavelengths of light cure the conformable material 702, such as UV wavelengths. In some embodiments, heat exposure cures the conformable material 802, instead of light 506.

Figure 9:
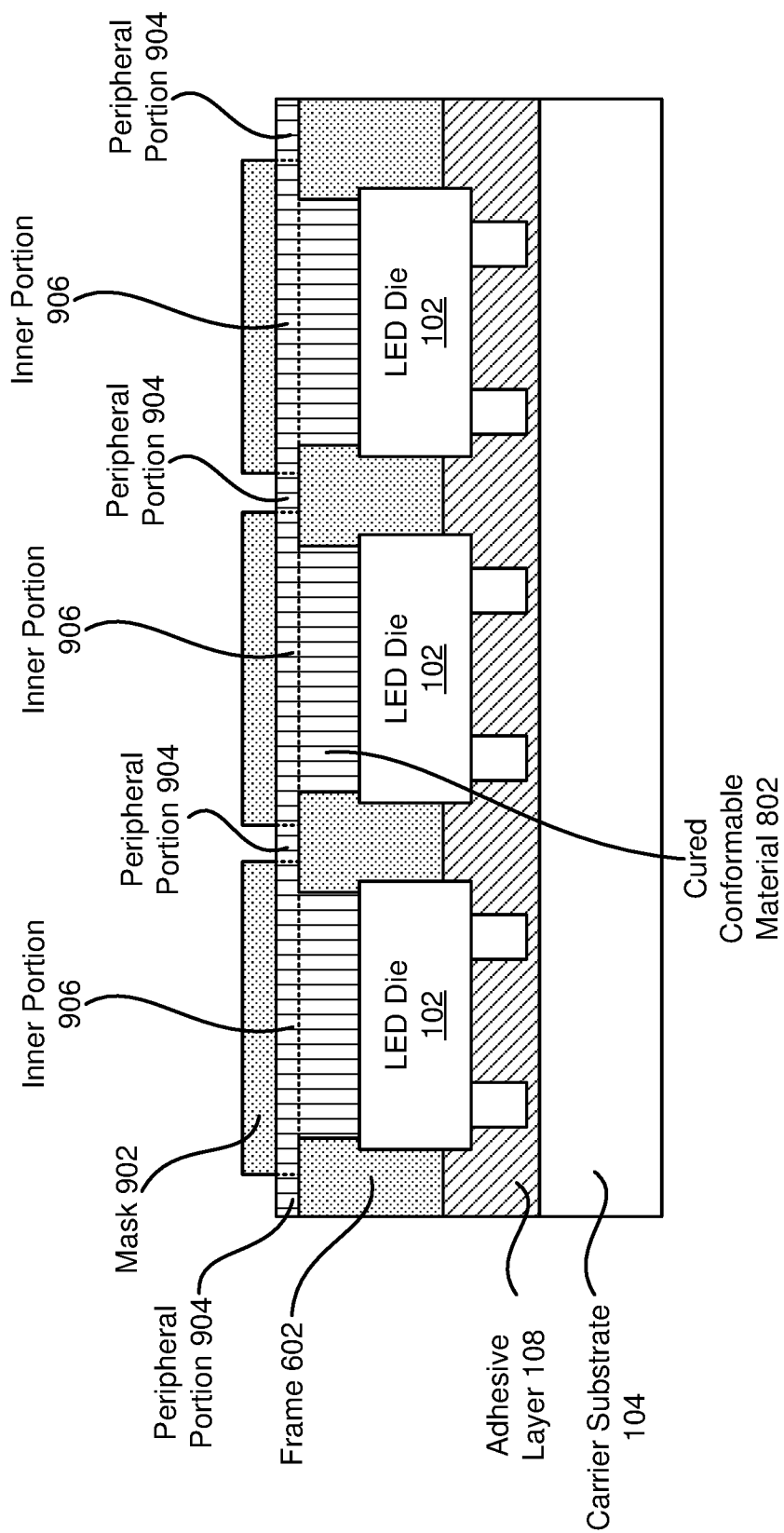
FIG. 9 is a cross sectional view of LED dies on the carrier substrate with an applied mask exposing a peripheral portion of the cured conformable material, according to one embodiment.

To form an elayer 110 with a flap 116 over each LED die 102, peripheral portions of the cured conformable material 802 may be removed. FIG. 9 is a cross sectional view of LED dies 102 on the carrier substrate 104 with an applied mask 902 over inner portions 906 and exposing the peripheral portions 904 of the cured conformable material 802, according to one embodiment. A peripheral portion 904 is a portion of the cured conformable material 802 defined exterior to the inner portion 906 of the top portion 704 of the cured conformable material 802. The mask 902 defines the size of the flap over each LED die 102, and exposes the peripheral portions 904 to be removed by an etching process, such as wet or dry etching. The mask 902 can be made of any removable material capable of protecting the inner portions 906 of the cured conformable material 802 from the etching process. For example, the mask 902 may be a photoresist that is formed from a lithographic process. In another example, the mask 902 is a metal mask that deposited over the cured conformable material 802.

Figure 10:
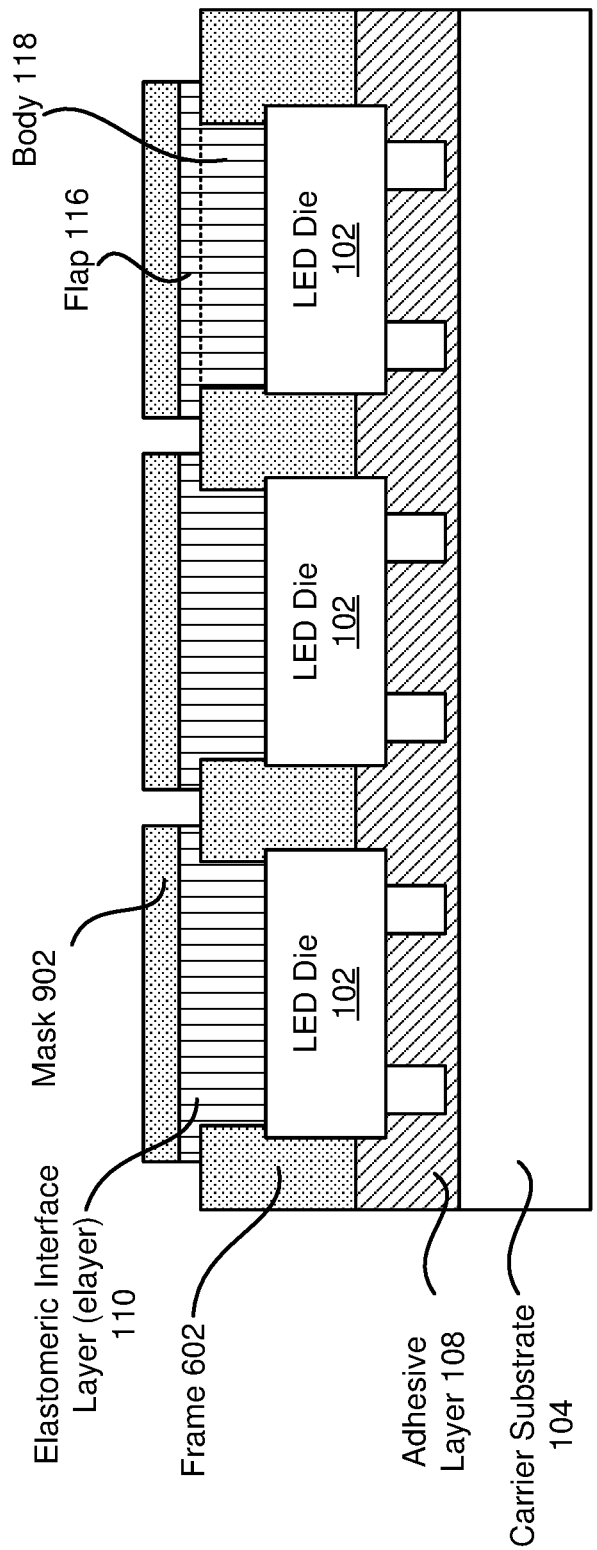
FIG. 10 is a cross sectional view of LED dies on the carrier substrate with elayers enclosed by the frame and mask, according to an embodiment.

FIG. 10 is a cross sectional view of LED dies 102 on the carrier substrate 104 with elayers 110 enclosed by the frame 602 and mask 902, according to an embodiment. After the peripheral portions 904 are removed, the remaining portions of the cured conformable material 802 form the elayers 110. Specifically, a body 118 and a flap 116 of the conformable material 802 form the elayer 110. Removal of the peripheral portion 904 also exposes the frame 602. As such, the frame 602 and mask 902 can be removed to leave an elayer 110 over each LED die 102 (as seen in FIG. 1). Depending on the structure of the mask 902, the mask 902 can be removed with a solvent or etching process. In embodiments where the frame 602 includes photosensitive material 402, the frame 602 can be washed away with one or more solvents capable of dissolving the photosensitive material 402 while not affecting the elayer 110. For example, the frame can be removed by applying light through the carrier substrate 104 to render the frame soluble. Afterwards, the frame 602 is removed with a solvent.

Figure 11:
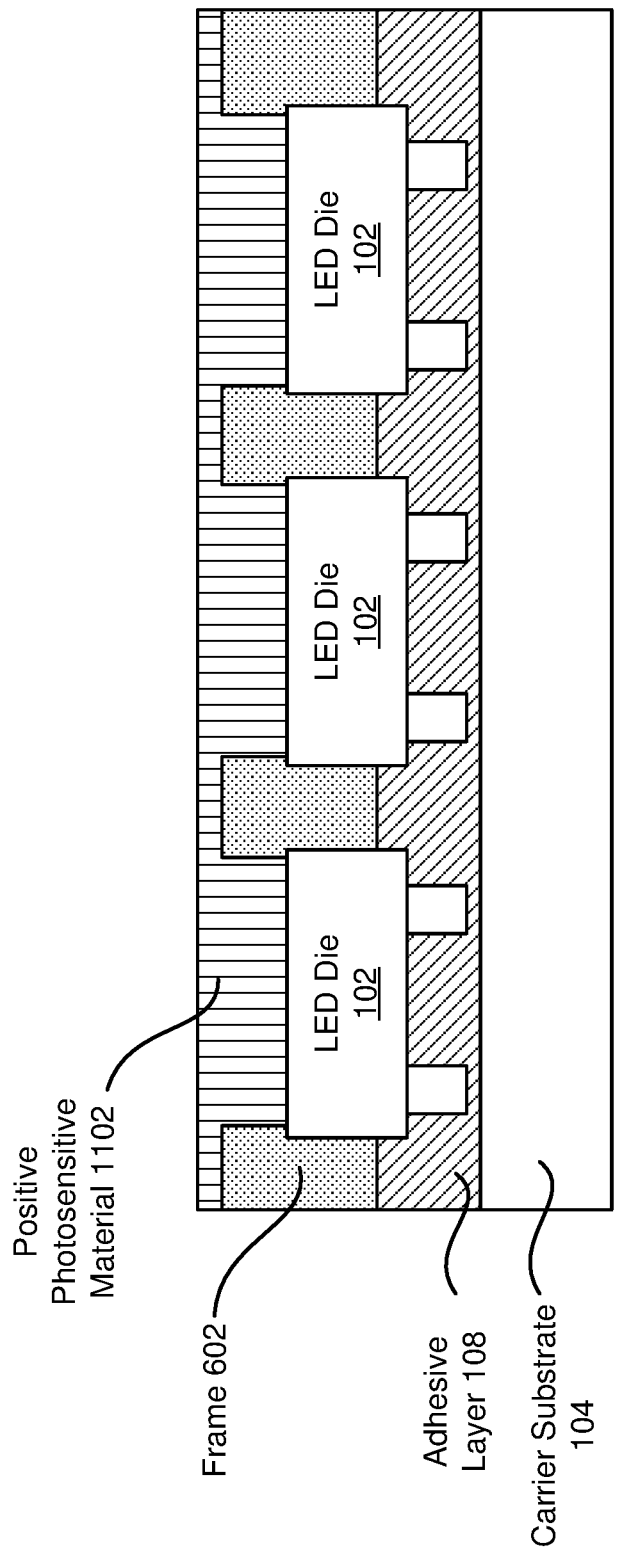
FIG. 11 is a cross sectional view of LED dies on the carrier substrate with positive photosensitive material over the LED dies and the frame, according to one embodiment.

In some embodiments, the conformable material 702 includes positive photosensitive material, instead of negative photosensitive material. FIG. 11 is a cross sectional view of LED dies 102 on the carrier substrate 104 with positive photosensitive material 1102 over the LED dies 102 and the frame 602, according to one embodiment. As such, similar to the positive photosensitive material 402 described with reference to FIG. 4, portions of the positive photosensitive material 1102 exposed to light become soluble.

Figure 12:
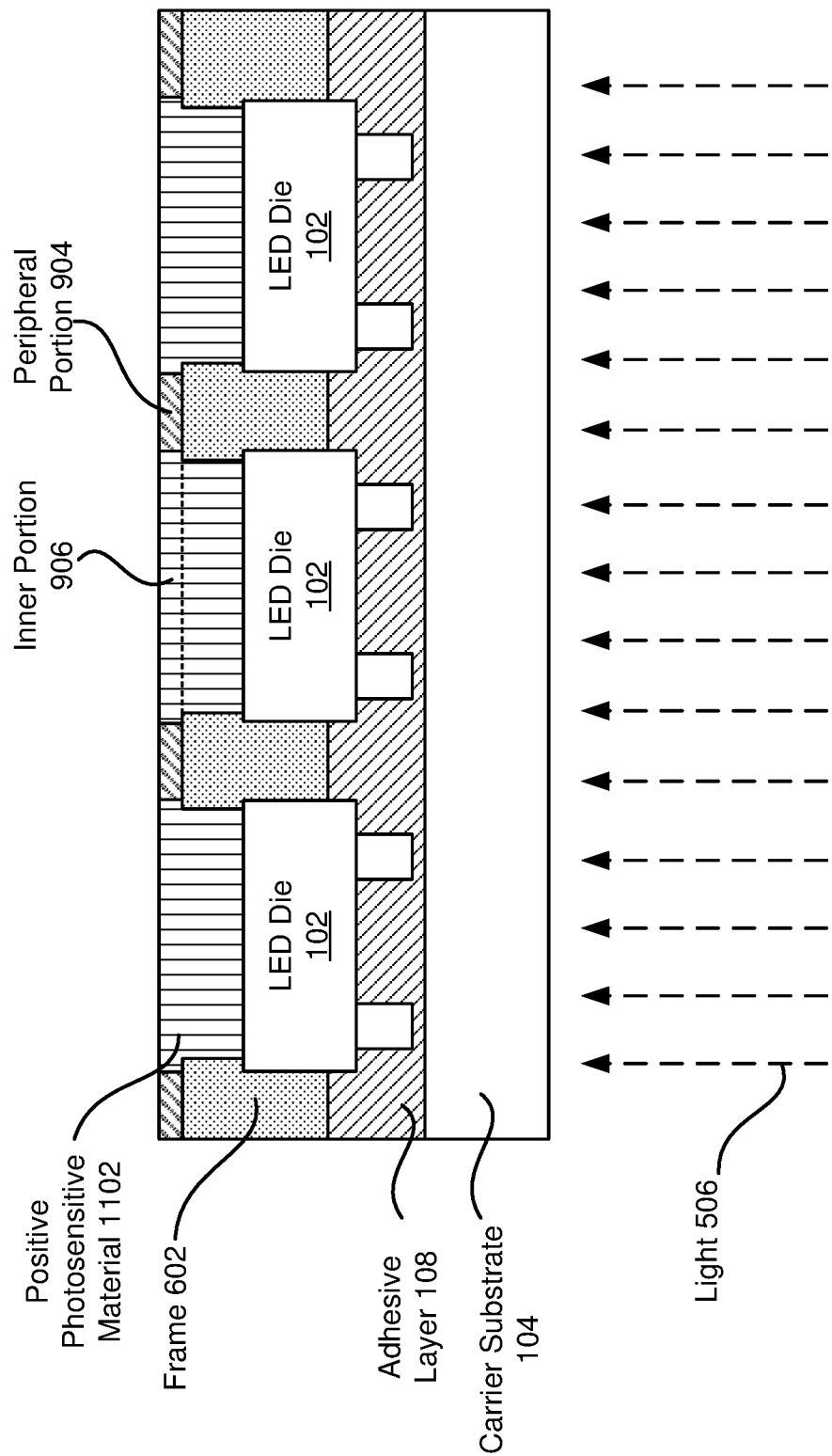
FIG. 12 is a cross sectional view of positive photosensitive material exposed to light through the carrier substrate, according to one embodiment.

FIG. 12 is a cross sectional view of positive photosensitive material 1102 exposed to light 506 through the carrier substrate 104, according to one embodiment. Specifically, the peripheral portions 904 of the positive photosensitive material 1102 over the frame 602 and between the LED dies 102 are rendered soluble by exposing them to light 506 through the carrier substrate 104. The LED dies 102 absorb portions of light 506 such that the regions of the positive photosensitive material 1102 over the LED dies 102 (the inner portions 906) are not exposed to light 506. In alternative embodiments, instead of shining light 506 through the carrier substrate 104, a mask 902 can be applied over the inner portions 906, similar to FIG. 9, so that light 506 can be applied above the positive photosensitive material 1102.

In embodiments where the frame 602 includes positive photosensitive material 402, the light 506 can also render the frame 602 soluble. However, in other embodiments that include positive photosensitive material 402, this may not occur. For example, the positive photosensitive material 1102 over the LED dies 102 is a different material than the positive photosensitive material 402 within the frame 602 such that the photosensitive material 1102 becomes soluble at different wavelengths than the positive photosensitive material 402.

After being rendered soluble, the peripheral portions 904 of soluble photosensitive material 904 and the frame 602 can be removed (e.g., with solvents) to form an elayer 110 with a flap over each LED die 102. Among other advantages, this technique can form elayers 110 without using the second mask 902.

Figure 13:
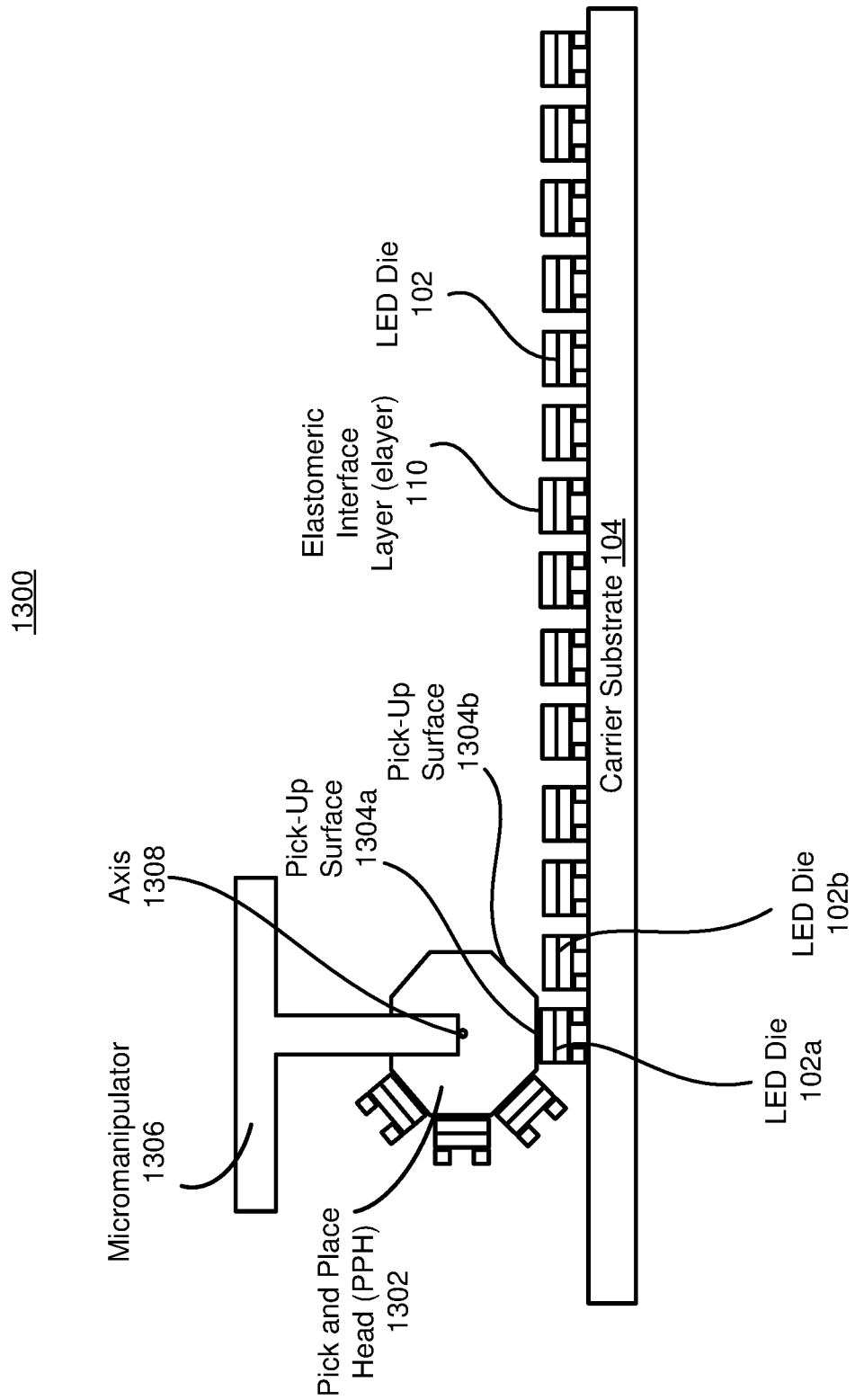
FIG. 13 is a display manufacturing system during pick up of the LED dies from a carrier substrate, according to one embodiment.

FIG. 13 is a display manufacturing system 1300 during pick up of the LED dies 102 from a carrier substrate 104, according to one embodiment. The system 1300 includes a PPH 1302 for picking LED dies 102 from the carrier substrate 104. The PPH 1302 is an example of a pick-up head that can be used to adhere with an elayer 110 of an LED die 102, although other types of pick-up heads may also be used. The system 1300 includes the LED dies 102, the carrier substrate 104, a micromanipulator 1306, a PPH 1302 defining an axis 1308, and pick-up surfaces 1304. The LED dies 102 are mounted to the carrier substrate 104. The micromanipulator 1306 moves the PPH 1302, such as with 6 degrees of freedom. The PPH 1302 includes pick-up surfaces 1304 that adheres with the elayers 110 of the LED dies 102 for pick and place operations.

The micromanipulator 1306 is connected to the PPH 1302 and controls movement of the PPH 1302. The micromanipulator 1306 aligns the PPH 1302 with the carrier substrate 104 to allow the PPH 1302 to pick up one or more LED dies 102. In some embodiments, the micromanipulator 1306 may be a multiple degree of freedom micromanipulator, such as a four degree of freedom micromanipulator configured to move the PPH 1302 up and down, left and right, forward and back, or rotate the PPH 1302 (e.g., along the rotational axis 1308). In some embodiments, the system 1300 includes multiple micromanipulators 1306 and/or PPHs 1302 perform pick and place tasks in parallel to increase throughput of the system.

The PPH 1302 has a polygon shaped cross section. The edges of the polygon shape cross section define multiple pick-up surfaces 1304 of the PPH 1302. The elayer 110 of each LED dies 102 are configured to mount to the pick-up surfaces 1304 (e.g., due to adhesion forces) to facilitate transfer of the LED dies 102 from the carrier substrate 104 to a display substrate 1402. The PPH 1302 may be rotated along the rotational axis 1308 to pick up arrays of LED dies 102 at one or more pick-up surfaces 1304. Although the PPH 1302 has an octagonal cross section and eight pick-up surfaces 1304, a PPH 1302 may have different shaped cross sections (e.g., triangular, square, hexagon, etc.) and different numbers of pick-up surfaces in various embodiments. Although the pick and place tool discussed herein is a PPH 1302, other types of pick-up heads using adhesive attachment with elayers 110 may be used.

The pick-up surfaces 1304 may be non-conformable pick-up heads that allow the LED dies 102 with elayers 110 to attach to the PPH 1302. For example, the pick-up surfaces 1304 may be glass or fused silica. The pick-up surfaces 1304 interface with the elayer 110 of the LED dies 102 using adhesion forces, such as Van der Waals. The adhesive layer 108 may be partially or fully removed from the carrier substrate 104 before the pick-up surfaces 1304 attach to the elayer 110 of each LED die 102. Although the elayers 110 discussed herein are particularly adapted for non-conformable pick-up heads, in some embodiments, the pick-up surfaces 1304 are conformable, such as with an elastomeric coating.

Subsequent to the PPH 1302 picking up the one or more first LED dies 102a with the first pick-up surface 1304a, the PPH 1302 is rotated about axis 1308 to pick up one or more second LED dies 102b with a second pick-up surface 1304b of the PPH 1302. The second pick-up surface 1304b may be adjacent to the first pick-up surface 1304a, as shown in FIG. 13, or may be a non-adjacent pick-up surface 1304 to the first pick-up surface 1304a.

Figure 14:
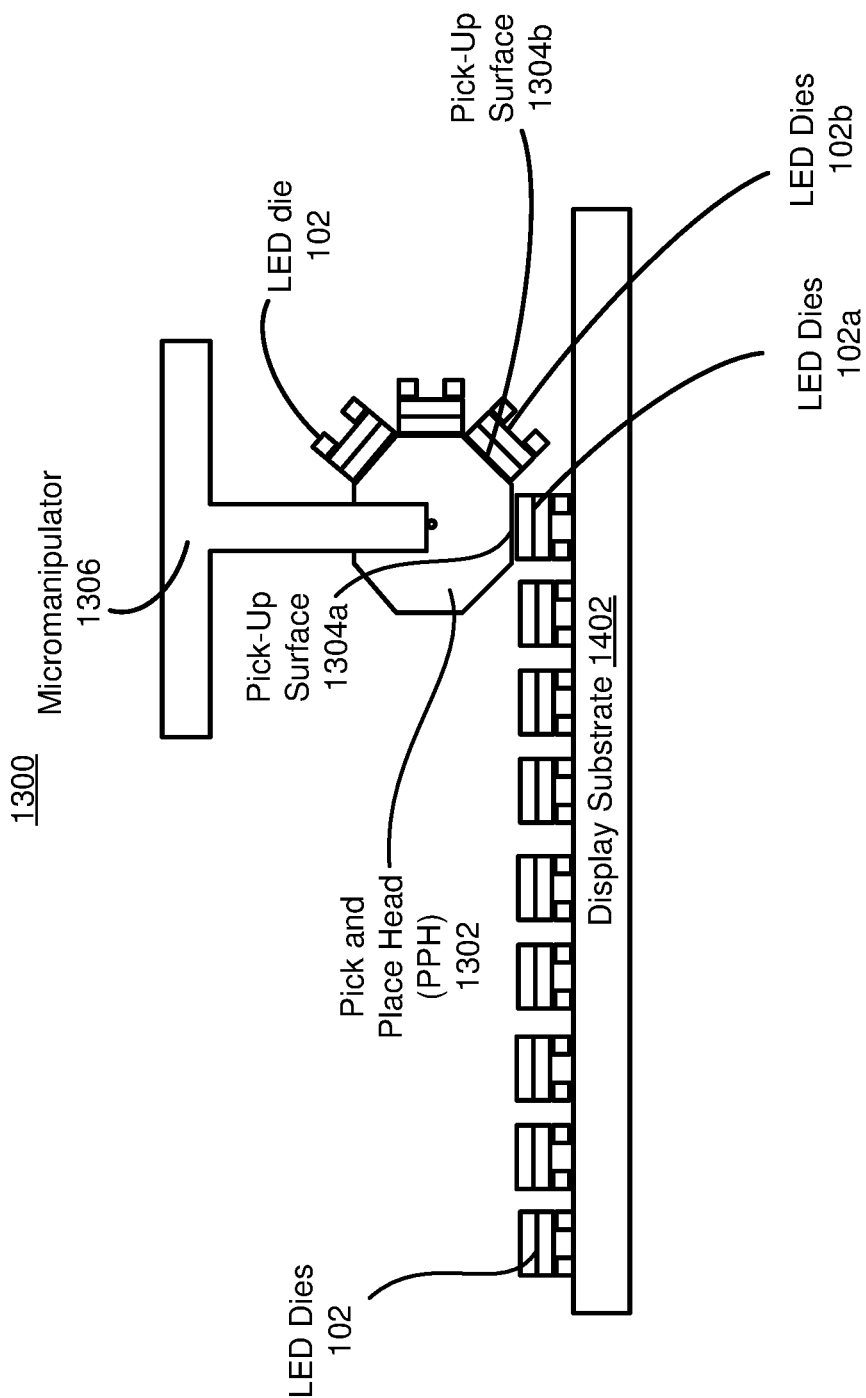
FIG. 14 is a cross sectional view of the display manufacturing system during LED die placement on a display substrate, according to one embodiment.

FIG. 14 is a cross sectional view of the display manufacturing system 1300 during LED die 102 placement on a display substrate 1402, according to one embodiment. The LED dies 102 attached to the PPH 1302 via the elayers 110 are placed on the display substrate 1402 of an electronic display.

After the PPH 1302 has been populated with LED dies 102, the PPH 1302 is moved away from the carrier substrate 104 and aligned with the display substrate 1402. For example, the PPH 1302 may be lifted away from the carrier substrate 104 by the micromanipulator 1306 for subsequent placement of the LED dies 102 on the display substrate 1402. The micromanipulator 1306 places the LED dies 102 on the display substrate 1402 by aligning the PPH 1302 with the display substrate 1402 and rolling the PPH 1302 across the display substrate 1402. The display substrate 1402 may be part of an electronic display with the LED dies 102 placed at sub-pixel locations to connect with the control circuits in the display substrate 1402 that drive the LED dies 102. For example, the display substrate 1402 may be a printed circuit board including gate lines and data lines for a control circuit at each sub-pixel that drive the LED dies 102 according to signals on the gate and data lines. After placement, the LED dies 102 may be bonded to the display substrate 1402, such as using thermocompression (TC) bonding.

Figure 15:
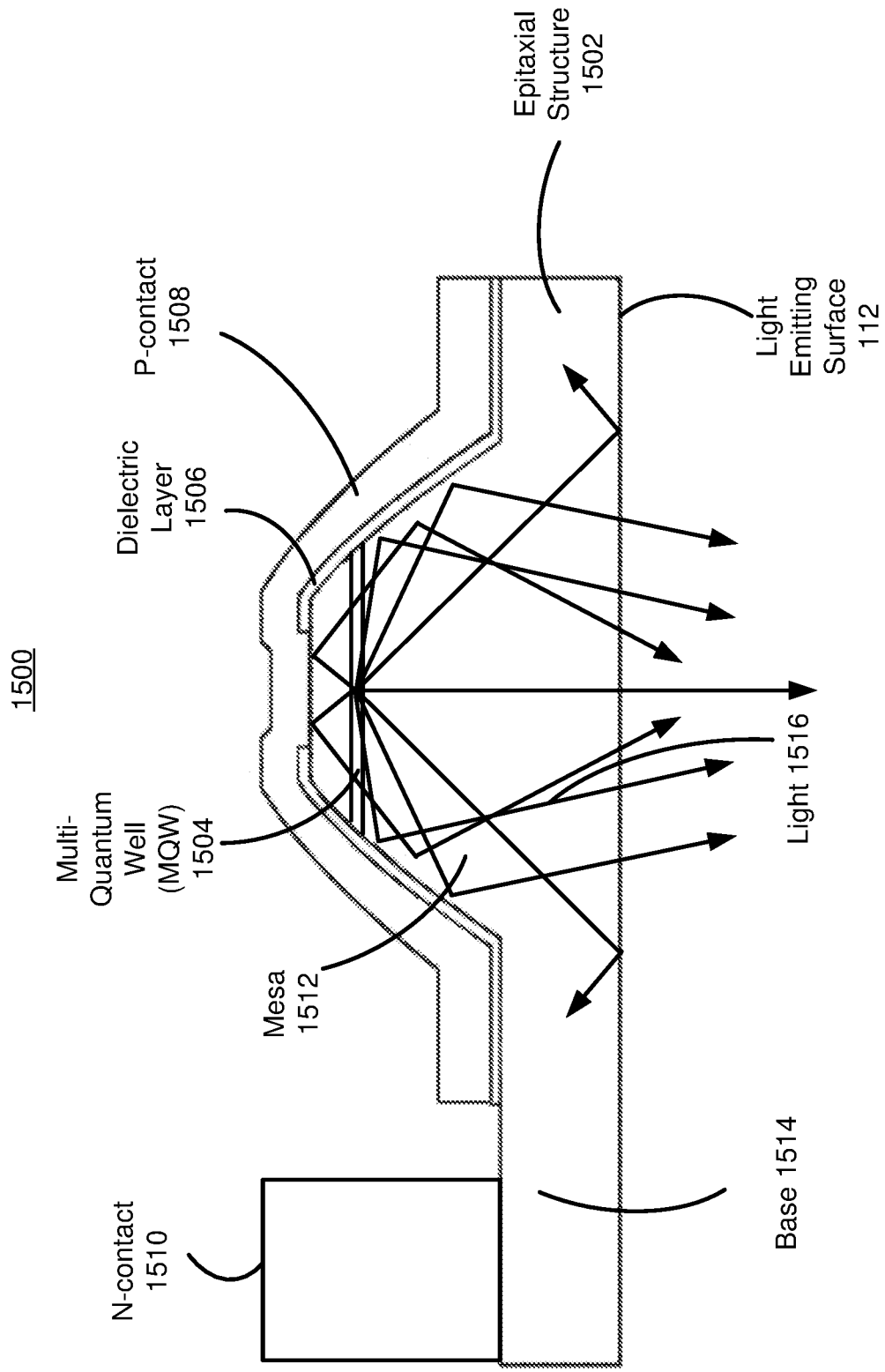
FIG. 15 is a schematic diagram of a cross section of a μLED, according to one embodiment.

FIG. 15 is a schematic diagram of a cross section of a μLED 1500, according to one embodiment. The μLED 1500 is an example of an LED die 102 having a light emitting surface 112 on which the elayer 110 is formed to facilitate adhesive attachment with a pick-up head. The μLED 1500 may include, among other components, an epitaxial structure 1502 formed on a growth substrate (not shown). The epitaxial structure 1502 includes a multi-quantum well ("MQW") 1504. The μLED 1500 further includes a dielectric layer 1506 on the epitaxial structure 1502, a p-contact 1508 on the dielectric layer 1506, and an n-contact 1510 on the epitaxial structure 1502. The epitaxial structure 1502 is shaped, such as via an etch process, into a mesa 1512 and a base 1514 of the mesa 1512. The multi-quantum well 1504 defines an active light emitting area that is included in the structure of the mesa 1512. The mesa 1512 may include a truncated top defined on a side opposed to a light emitting surface 112 of the μLED 1500. The feature size of the μLED 1500 (e.g., the diameter) may range from sub-micrometers to tens of micrometers (e.g., from 0.1 μm to 10 μm). The pitch (e.g., spacing between μLEDs) may similarly range from sub-micrometers to tens of micrometers.

If the semiconductor structure of the μLED 1500 is grown on a growth substrate, such as a non-transparent substrate, the growth substrate may be removed to reveal the light emitting surface 112 as shown in FIG. 15. In another example, the growth substrate is not removed, such as when the growth substrate is transparent for the light emitted by the μLED 1500.

The mesa 1512 may include various shapes, such as a parabolic shape with a truncated top, to form a reflective enclosure for light 1516 generated within the μLED 1500. In other embodiments, the mesa 1512 may include a cylindrical shape with a truncated top, or a conic shape with a truncated top. The arrows show how the light 1516 emitted from the MQW 1504 is reflected off the p-contact 1508 and internal walls of the mesa 1512 toward the light emitting surface 112 at an angle sufficient for the light to escape the μLED device 1500 (i.e., within a critical angle of total internal reflection). The p-contact 1508 and the n-contact 1510 connect the μLED 1500, such as to the display substrate including a control circuit for the μLED 1500. The n-contact 1510 is formed at the base 1514 on a side opposite the light emitting surface 112.

The μLED 1500 may include an active light emitting area defined by the MQW 1504. The μLED 1500 directs the light 1516 from the MQW 1504 and increases the brightness level of the light output. In particular, the mesa 1512 and p-contact 1508 cause reflection of the light 1516 from the MWQ 1504 to form a collimated or quasi-collimated light beam emerging from the light emitting surface 112.

Figure 16:
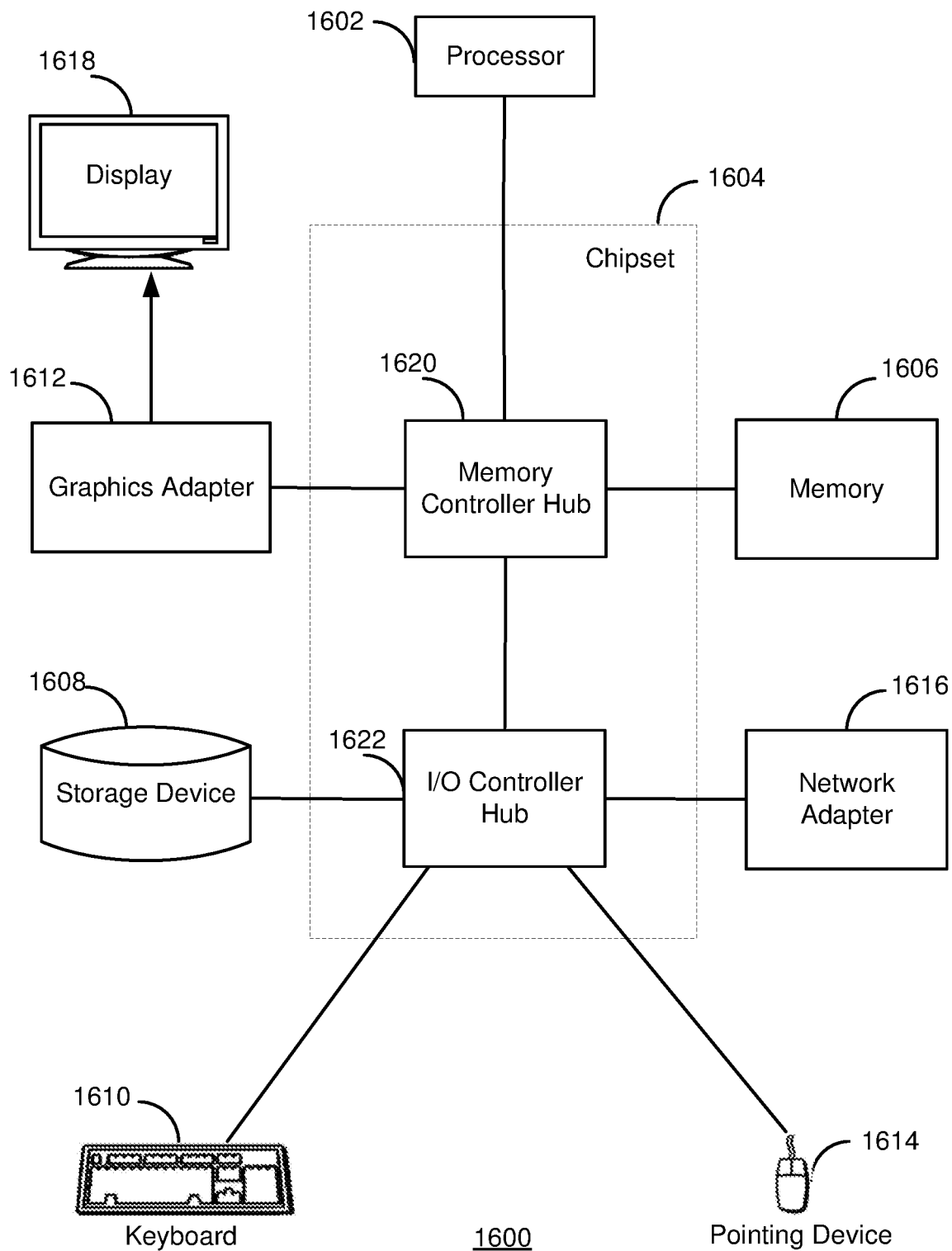
FIG. 16 is a high-level block diagram illustrating an example of a computer system for use in the display manufacturing system shown above, according to one embodiment.

FIG. 16 is a high-level block diagram illustrating an example of a computer system 1600 for use in the display manufacturing system 1300 shown above, according to one embodiment. The computer system 1600 may be used to control the manufacturing processes discussed herein. For example, the method 200 shown in FIG. 2 may be performed under the control of the computing system 1600. Illustrated in FIG. 16 are at least one processor 1602 coupled to a chipset 1604. The chipset 1604 includes a memory controller hub 1620 and an input/output (I/O) controller hub 1622. A memory 1606 and a graphics adapter 1612 are coupled to the memory controller hub 1620, and a display device 1618 is coupled to the graphics adapter 1612. A storage device 1608, keyboard 1610, pointing device 1614, and network adapter 1616 are coupled to the I/O controller hub 1622. Other embodiments of the computer 1600 have different architectures. For example, the memory 1606 is directly coupled to the processor 1602 in some embodiments.

The storage device 1608 includes one or more non-transitory computer-readable storage media such as a hard drive, compact disk read-only memory (CD-ROM), DVD, or a solid-state memory device. The memory 1606 holds instructions and data used by the processor 1602. For example, the memory 1606 may store instructions that when executed by the processor 1602, configures the processor to perform the method 200. The pointing device 1614 is used in combination with the keyboard 1610 to input data into the computer system 1600. The graphics adapter 1612 displays images and other information on the display device 1618. In some embodiments, the display device 1618 includes a touch screen capability for receiving user input and selections. The network adapter 1616 couples the computer system 1600 to a network. Some embodiments of the computer 1600 have different and/or other components than those shown in FIG. 16.

The computer 1600 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 1608, loaded into the memory 1606, and executed by the processor 1602. For example, program instructions for the method describe herein can be stored on the storage device 1608, loaded into the memory 1606, and executed by the processor 1602.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
   forming a frame along a side surface of a light emitting diode (LED) die on a carrier substrate, the frame extending partially above a light emitting surface of the LED die, the frame and the light emitting surface of the LED die defining a recessed region;
   depositing a conformable material on the LED die including in the recessed region to form a body portion of the conformable material, and over the recessed region and over the frame to form a top portion of the conformable material over the body portion;
   removing parts of the top portion of the conformable material to form a conformable flap, wherein at least a portion of a bottom surface of the conformable flap is over the frame; and
   removing the frame to form a conformable interface layer of the LED die comprising the body portion and the conformable flap on the body portion.

2. The method of claim 1, wherein the conformable flap defines a surface area that is larger than a surface area of the body portion.

3. The method of claim 1, wherein the conformable flap has a width that is larger than a width of the body portion.

4. The method of claim 1, further comprising:
   subsequent to depositing the conformable material, applying a mask over the conformable material, the mask exposing the parts of the top portion of the conformable material;
   etching the parts of the conformable material; and
   removing the mask after etching the parts of the conformable material.

5. The method of claim 4, further comprising applying light to the conformable material to cause the conformable material that is made of negative photosensitive material to be insoluble prior to applying the mask over an inner portion of the conformable material, and wherein the conformable material includes negative photosensitive material.

6. The method of claim 1, further comprising applying light through the carrier substrate, a first portion of the light being absorbed by the LED die and a second portion of the light other than the first portion causing a peripheral portion of the conformable material of positive photosensitive material to be soluble for removal.

7. The method of claim 1, wherein forming the frame at the side surface of the LED die comprises:
   depositing a positive photosensitive material over the light emitting surface and along the side surface of the LED die;
   applying a mask over a first portion of the positive photosensitive material, the mask exposing a second portion of the positive photosensitive material other than the first portion over the light emitting surface of the LED die;
   applying light to the second portion of the positive photosensitive material over the light emitting surface to cause the second portion of the positive photosensitive material to be soluble; and
   removing the mask and the second portion of the positive photosensitive material to form the frame from the first portion of the positive photosensitive material.

8. The method of claim 1, further comprising:
   picking up the LED die on the carrier substrate by attaching a pick-up head to the conformable interface layer over the light emitting surface of the LED die; and
   placing the LED die attached to the pick-up head on a display substrate including a pixel control circuit of an electronic display.

9. The method of claim 8, wherein the conformable flap provides a surface area for adhesion with the pick-up head that is larger than a surface area of the light emitting surface.

10. The method of claim 1, wherein a plurality of LED dies are present on the carrier substrate, the frame is formed between two adjacent LED dies of the plurality of LED dies to form a plurality of recessed regions, the conformable material is deposited in the plurality of recessed regions to form body portions and over the frame to form top portions.

11. A method comprising:
    forming a frame in direct contact with a side surface of a light emitting diode (LED) die on a carrier substrate, the frame extending partially above a light emitting surface of the LED die, the frame and the light emitting surface of the LED die defining a recessed region;

depositing a conformable material on the LED die including in the recessed region to form a body portion of the conformable material, and over the recessed region and over the frame to form a top portion of the conformable material over the body portion;

removing parts of the top portion of the conformable material to form a conformable flap; and removing the frame to form a conformable interface layer of the LED die comprising the body portion and the conformable flap on the body portion.

12. The method of claim 11, wherein the conformable flap defines a surface area that is larger than a surface area of the body portion.

13. The method of claim 11, wherein the conformable flap has a width that is larger than a width of the body portion.

14. The method of claim 11, further comprising applying light through the carrier substrate, a first portion of the light being absorbed by the LED die and a second portion of the light other than the first portion causing a peripheral portion of the conformable material of positive photosensitive material to be soluble for removal.

15. The method of claim 11, wherein a plurality of LED dies are present on the carrier substrate, the frame is formed between two adjacent LED dies of the plurality of LED dies to form a plurality of recessed regions, the conformable material is deposited in the plurality of recessed regions to form body portions and over the frame to form top portions.

16. A display manufacturing system comprising:
one or more processors; and
a computer-readable readable medium storing instructions that when executed by the one or more processors cause the one or more processors to:
form a frame along a side surface of a light emitting diode (LED) die on a carrier substrate, the frame extending above a light emitting surface of the LED die, the frame and the light emitting surface of the LED die defining a recessed region;
deposit a conformable material on the LED die including in the recessed region to form a body portion of the conformable material, and over the recessed region and over the frame to form a top portion of the conformable material over the body portion;
remove parts of the top portion of the conformable material to form a conformable flap; and
remove the frame to form a conformable interface layer of the LED die comprising the body portion and the conformable flap on the body portion.

17. The display manufacturing system of claim 16, wherein the instructions forming the frame at the side surface of the LED die further configure the one or more processors to:
deposit a positive photosensitive material over the light emitting surface and along the side surface of the LED die;
apply a mask over a first portion of the positive photosensitive material, the mask exposing a second portion of the positive photosensitive material other than the first portion over the light emitting surface of the LED die;
apply light to the second portion of the positive photosensitive material over the light emitting surface to cause the second portion of the positive photosensitive material to be soluble; and
remove the mask and the second portion of the positive photosensitive material to form the frame from the first portion of the positive photosensitive material.

18. The display manufacturing system of claim 16, wherein the conformable material includes negative photosensitive material, a peripheral portion is removed by etching, and the instructions further configure the one or more processors to apply light to the conformable material to cause the conformable material to be insoluble prior to applying a mask over an inner portion of the conformable material.

19. The display manufacturing system of claim 16, wherein the instructions forming the frame at the side surface of the LED die further configure the one or more processors to:
pick up the LED die on the carrier substrate by attaching a pick-up head to the conformable interface layer over the light emitting surface of the LED die; and
place the LED die attached to the pick-up head on a display substrate including a pixel control circuit of an electronic display.

20. The display manufacturing system of claim 19, wherein the conformable flap provides a surface area for adhesion with the pick-up head that is larger than a surface area of the light emitting surface.

* * * * *

UNITED STATES PATENT AND TRADEMARK OFFICE
CERTIFICATE OF CORRECTION

| | |
|---|---|
| PATENT NO. | : 11,145,797 B1 |
| APPLICATION NO. | : 16/263477 |
| DATED | : October 12, 2021 |
| INVENTOR(S) | : Oscar Torrents Abad |

It is certified that error appears in the above-identified patent and that said Letters Patent is hereby corrected as shown below:

In the Claims

In Column 13, Claim 16, Line 31, delete "computer-readable readable" and insert -- computer-readable --, therefor.

Signed and Sealed this
Seventh Day of March, 2023

Katherine Kelly Vidal
*Director of the United States Patent and Trademark Office*